United States Patent
Ohnishi et al.

(10) Patent No.: US 6,878,202 B2
(45) Date of Patent: Apr. 12, 2005

(54) METHOD FOR GROWING SINGLE CRYSTAL OF COMPOUND SEMICONDUCTOR AND SUBSTRATE CUT OUT THEREFROM

(75) Inventors: Masaya Ohnishi, Ibaraki-ken (JP); Kenya Itani, Ibaraki-ken (JP); Seiji Mizuniwa, Ibaraki-ken (JP); Hiroshi Sasabe, Ibaraki-ken (JP); Inao Fujisaki, Ibaraki-ken (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/112,700

(22) Filed: Apr. 2, 2002

(65) Prior Publication Data

US 2002/0139296 A1 Oct. 3, 2002

(30) Foreign Application Priority Data

Apr. 3, 2001 (JP) ........................................ 2001-105090

(51) Int. Cl.$^7$ .............................................. C30B 15/24
(52) U.S. Cl. ........................................................ 117/83
(58) Field of Search ................................ 117/81, 82, 83

(56) References Cited

U.S. PATENT DOCUMENTS

| | | | | |
|---|---|---|---|---|
| 4,521,272 A | * | 6/1985 | Gault | 156/616 R |
| 5,105,254 A | * | 4/1992 | Terao | 257/49 |
| 5,871,580 A | * | 2/1999 | Asahi et al. | 117/83 |
| 6,703,288 B2 | * | 3/2004 | Nagasawa et al. | 438/483 |

FOREIGN PATENT DOCUMENTS

| | | | | |
|---|---|---|---|---|
| JP | 405221772 A | * | 8/1993 | ........... C30B/11/14 |
| JP | 09-157093 | | 6/1997 | |
| JP | 11-27-021 | | 10/1999 | |

* cited by examiner

*Primary Examiner*—Nadine G. Norton
*Assistant Examiner*—Matthew Anderson
(74) *Attorney, Agent, or Firm*—Sughrue Mion, PLLC

(57) ABSTRACT

A method for growing a compound semiconductor single crystal comprising cooling a starting material melt of a compound semiconductor with an upward increasing temperature gradient in a crystal-growing container having a seed crystal placed at a lower end, thereby growing a single crystal upward from the seed crystal, the crystal orientation of the seed crystal in a crystal growth axis direction being an offset orientation of $<100>+\theta$, wherein the offset angle $\theta$ is $2° \leq \theta \leq 55°$.

12 Claims, 2 Drawing Sheets

METHOD FOR GROWING SINGLE CRYSTAL OF COMPOUND SEMICONDUCTOR AND SUBSTRATE CUT OUT THEREFROM

FIELD OF THE INVENTION

The present invention relates to a method for growing a compound semiconductor single crystal from a seed crystal in an offset direction, and a substrate with a slanted surface orientation cut out from such a compound semiconductor single crystal.

BACKGROUND OF THE INVENTION

Recently, laser diodes utilizing compound semiconductor materials such as GaAs, etc. have been developed as optical devices for transmitting large-volume information at a high speed. Such optical devices comprise multi-layer thin films having hetero structures, and the thin films are generally formed by a gas-phase epitaxial method or a molecular beam epitaxial method. Because the optical devices are strongly required to have such characteristics as stability and long life, epitaxial layers should have as little defect density as possible. Accordingly, it is required that semiconductor substrates on which epitaxial layers are formed have a low dislocation density.

Substrates for devices are generally cut out from semiconductor single crystals. Methods for producing semiconductor single crystals include a gas phase growing method, a liquid phase growing method, and a solid phase growing method, and single crystals of compound semiconductors are mostly produced by the liquid phase growing method. Methods for growing single crystals from seed crystals by solidifying starting material melts, as one type of the liquid phase growth method, include a horizontal Bridgman method, a vertical Bridgman method, a gradient freezing method (GF method), and a Czochralski method (CZ method) and its improved method such as a liquid-encapsulated Czochralski method (LEC method), etc.

Recently, much attention is paid to a vertical Bridgman method (VB method) as a method for producing single crystals of compound semiconductors having large diameters of 3 inches (76.2 mm) or more and a low dislocation density, to achieve the mass-production of optical devices. For instance, when a single crystal of a GaAs compound semiconductor is formed by the VB method, starting materials consisting of Ga and As or GaAs are charged into a crystal-growing container having a bottom on which a GaAs seed crystal is disposed, the crystal-growing container containing a starting material melt obtained by heating is moved in a space having a temperature gradient in a vertical direction, so that crystallization occurs from the lower side (from the side of the seed crystal) toward the upper side. As a result, a single crystal grows from the seed crystal in a direction in perpendicular to its surface. Thus, the VB method can form high-quality, large-diameter single crystals of compound semiconductors with few crystal defects.

Because starting materials for a compound semiconductor single crystal usually include high-vapor pressure elements, a sealable crystal-growing container is used to produce the compound semiconductor single crystal. Because crystal growth is carried out at extremely small temperature gradients both in a growth orientation of the single crystal and in a radial direction thereof in perpendicular to the growth orientation, the generation of thermal strain is suppressed to obtain a low-dislocation single crystal.

In the vertical GF method, with a container containing a single crystal at its lower end located at a fixed position, the temperature is lowered while maintaining a vertical temperature gradient to subject the starting materials in the container to a similar thermal hysteresis to that in the vertical Bridgman method, to cause solidification by cooling, so that a single crystal is caused to grow in a direction in perpendicular to the surface of the seed crystal. Except for these points, it is essentially the same as the VB method.

However, because the surface orientations of device-forming surfaces of single crystal substrates have conventionally been mostly <100>, the crystal growth axis directions of the seed crystals used for growing the single crystals have also been generally <100>. However, depending on the types of epitaxial methods and device structures (thin film structures), the device-forming surface of the single crystal substrate is not necessarily a (100) face, but the surface orientations offsetting from the (100) face by an angle θ of about 2°, 10° or 15° have recently become used widely. Therefore, offset substrates were conventionally cut out in a direction inclined by the predetermined angle θ from the single crystal growing in a <100> direction. Here, the crystal orientation of <100>+θ is called "offset orientation," and the slanting angle θ is called "offset angle."

Because the crystal growth surface is horizontal in a crystal growth method such as a vertical Bridgman method, the concentration of a dopant (Si, Zn, etc.) is uniform in a radial direction of the single crystal. However, because the dopant, etc. tend to be segregated in the growth orientation, there is likely a concentration gradient of the dopant, etc. in a growth orientation in the grown single crystal. However, because in-plane uniformity, particularly the uniformity of a carrier concentration, is important for substrates used for optical devices, etc., the non-uniformity of a carrier concentration leads to unevenness in the characteristics of devices formed on the substrate surface. Accordingly, the substrates are required to have high uniformity in the carrier concentration in their surfaces.

On the other hand, in the case of a compound semiconductor single crystal obtained by crystal growth, for instance, from a seed crystal whose crystal growth axis direction is <100> according to the conventional method, a surface orientation-slanted substrate obtained by slantingly slicing the single crystal inherits the above dopant concentration distribution in the single crystal growth axis direction, whereby the dopant concentration distribution (thus carrier concentration distribution) in the substrate surface is disadvantageously non-uniform.

In addition, in the conventional method for cutting a surface orientation-slanted substrate slantingly from a growth orientation, there are large regions in both vertical end portions of the single crystal, from which substrates of the desired size cannot be cut out, resulting in low efficiency (yield) in utilizing the single crystal.

OBJECTS OF THE INVENTION

Accordingly, an object of the present invention is to provide a method for growing a compound semiconductor single crystal, which has an extremely uniform carrier concentration distribution in a surface in perpendicular to the crystal growth axis direction, suffering from few loss when cutting out substrates therefrom.

Another object of the present invention is to provide a substrate obtained by such a method, which has a uniform radial distribution of carrier concentration.

DISCLOSURE OF THE INVENTION

As a result of intensive research in view of the above objects, the inventors have found that by growing a single crystal, for instance, such that its <100> crystal orientation is offset from the crystal growth axis direction, and by slicing this single crystal in perpendicular to the crystal growth axis direction, it is possible to obtain a surface orientation-slanted substrate having a uniform carrier concentration distribution in its surface. The present invention has been completed based on this finding.

Thus, the method for growing a compound semiconductor single crystal according to the present invention comprises cooling a starting material melt of a compound semiconductor with an upward increasing temperature gradient in a crystal-growing container having a seed crystal placed at a lower end, thereby growing a single crystal upward from the seed crystal, the crystal orientation of the seed crystal in a crystal growth axis direction being an offset orientation.

The crystal orientation is preferably <100>+θ. The offset angle θ is preferably $2° \leq θ \leq 55°$.

The method of the present invention is carried out preferably by a vertical Bridgman method or a vertical gradient freezing method.

The substrate of the present invention is cut out from the compound semiconductor single crystal obtained by the above method. The substrate is cut out preferably in perpendicular to the crystal growth axis direction.

The compound semiconductor is preferably a III-V or II-VI compound semiconductor, specifically a GaAs compound semiconductor.

DESCRIPTION OF THE PREFERRED EMBODIMENTS

Taking as an example the growing of a GaAs single crystal, one of III-V compound semiconductors, by a vertical Bridgman method, an embodiment of the present invention will be described in detail referring to the attached drawings without intention to restrict it thereto.

Figure 1:
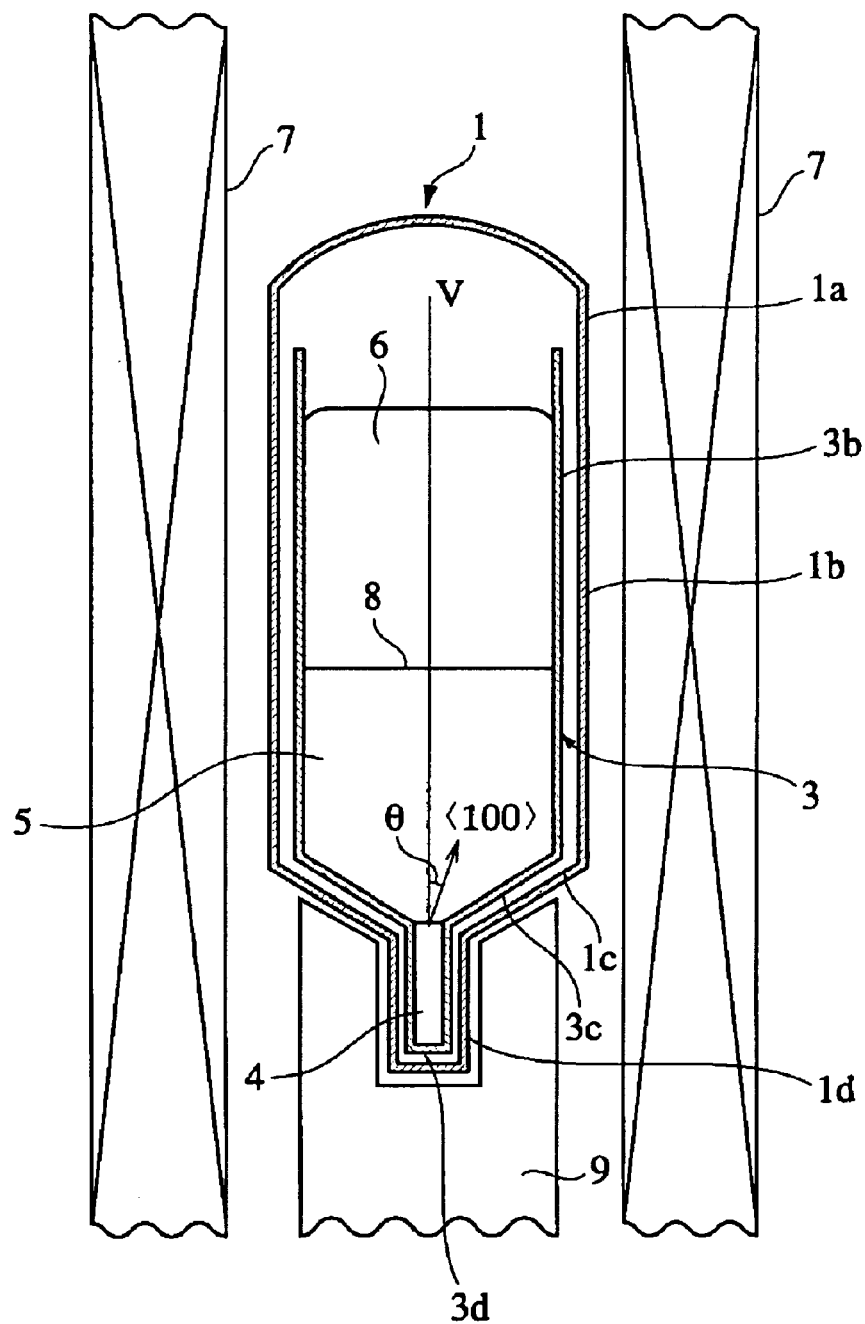
FIG. 1 is a cross-sectional view showing an apparatus for growing a compound semiconductor single crystal by a vertical Bridgman method.

FIG. 1 is a cross-sectional view showing an apparatus for growing a single crystal according to an embodiment of the present invention. A sealed, elongated quartz container 1 has a cylindrical cross section comprising an upper portion 1a, a large-diameter, cylindrical portion 1b, a tapered shoulder portion 1c and a thin tube portion 1d successively from above. Disposed inside the container 1 is a container 3 having an open end and made of pyrolytic boron nitride (pBN). The pBN container 3 has a cylindrical cross section comprising a large-diameter, cylindrical portion 3b, a tapered shoulder portion 3c and a thin tube portion 3d successively from above, and a seed crystal is disposed in the thin tube portion 3d.

A cylindrical heating apparatus 7 is arranged around a container 1 made of quartz, and the quartz container 1 comprises a supporter 9 in a lower portion, the supporter 9 being movable up and down in the cylindrical heating apparatus 7. Because the supporter 9 is provided at an upper end with a recess in a shape complementary to the tapered shoulder portion 1c and the thin tube portion 1d of the container 1 made of quartz, the quartz container 1 is movable up and down while being fixedly supported by the supporter 9.

After a seed crystal 4 is placed in a thin tube portion 3d of the pBN container 3, a compound semiconductor starting material such as GaAs is charged into the pBN container 3. After the pBN container 3 is placed in the quartz container 1, the quartz container 1 is sealed in vacuum and placed on the supporter 9 positioned in the cylindrical heating apparatus 7.

With the temperature of the cylindrical heating apparatus 7 set to have such a gradient (1° C./cm to 10° C./cm) that the higher the position, the higher the temperature, the container 1 is held at a sufficiently high-temperature position to melt the starting material for GaAs. After seeding, the container 1 is gradually moved downward together with the supporter 9, whereby the temperature of the GaAs melt in the pBN container 3 is lowered while keeping the above temperature gradient. As a result, the GaAs melt is crystallized from the seed crystal 4 positioned in the thin tube portion 3d at the lower end of the pBN container 3 to a GaAs single crystal, which grows upward. FIG. 1 shows a state in which the GaAs single crystal is growing. There is a growth interface 8 between the grown single crystal 5 and the melt 6.

The crystal growth speed is controlled such that the growth interface 8 is kept horizontal, thereby causing latent heat to fully dissipate from the side of the seed crystal 4. Alternatively, an apparatus (not shown) for locally cooling only a lower portion of the seed crystal 4b may be used. After the completion of single crystallization, the GaAs single crystal was cooled to room temperature at a cooling speed of 20° C./hr to 100° C./hr.

The important feature of the present invention is to use a crystal having the desired offset orientation as a seed crystal 4. The offset orientation is preferably <100>+θ, and the offset angle θ is preferably $2° \leq θ \leq 55°$. When the offset angle θ is less than 2°, there is only an insufficient function as the offset substrate. On the other hand, when the offset angle θ exceeds 55°, there is a crystal surface equivalent to the range of $0° \leq θ \leq 55°$, so that there is no meaning in regulating the offset angle θ. It is practically rare to use the surface orientation θ of 20° or more, and the offset angle θ is preferably 2°–15°.

Because the crystal growth axis direction V of the GaAs single crystal 5 is an offset orientation (<100>+θ) as shown in FIG. 1, the substrate obtained by slicing the GaAs single crystal in perpendicular to the growth orientation has the same offset orientation as above. Because the growth interface of the GaAs single crystal coincides with the sliced substrate surface, the substrate has an extremely uniform in-plane carrier concentration distribution. Also, because there is no region less than the desired size in both end portions of a cylindrical body portion of the single crystal, there is only few loss in slicing. Therefore, it is possible to obtain substrates efficiently even from both end portions of the cylindrical body portion of the single crystal.

The present invention will be described in detail referring to Examples below without intention of limiting the present invention thereto.

EXAMPLE 1

COMPARATIVE EXAMPLE 1

After a seed crystal 4 having a crystal growth axis direction offset by 10° from a [100] orientation toward a [011] orientation and 6500 g of GaAs were charged into a pBN container 3 shown in FIG. 1, the pBN container 3 was placed in a quartz container 1, which was sealed in vacuum. With the container 1 placed on a supporter 9, the container 1 was held in a cylindrical heating apparatus 7. The cylindrical heating apparatus 7 elevated the temperature at the position of the seed crystal 4 to about 1200° C., and the temperature of a starting material for GaAs above the seed crystal to about 1245° C., with a temperature gradient in a vertical direction set at about 5° C./cm.

After melting GaAs, seeding was carried out while maintaining the temperature gradient at a growth interface at about 5° C./cm. After seeding, the container 1 was lowered at a speed of 3 mm/hr to cause a GaAs single crystal to grow from the seed crystal 4. After fully crystallized, the resultant GaAs single crystal was cooled to room temperature at a cooling speed of about 30° C./hr, and the container 1 was then taken out of the cylindrical heating apparatus 7. A low-dislocation density GaAs single crystal having a cylindrical body portion of about 80 mm in diameter and about 180 mm in length was obtained by this method. The in-plane dislocation density of the resultant GaAs single crystal was as small as $50/cm^2$ on average. This GaAs single crystal was sliced in perpendicular to its crystal growth axis direction, to obtain a surface orientation-slanted substrate of GaAs having a surface orientation offset by 10° from the (100) face toward the (011) face (Example 1).

Also, using a seed crystal whose crystal growth axis direction was [100], a conventional substrate (Comparative Example 1) was prepared in the same manner as in Example 1 except for slicing the single crystal at a slanting angle of 10° toward the [011] orientation relative to the crystal growth axis direction of the single crystal.

Figure 2:
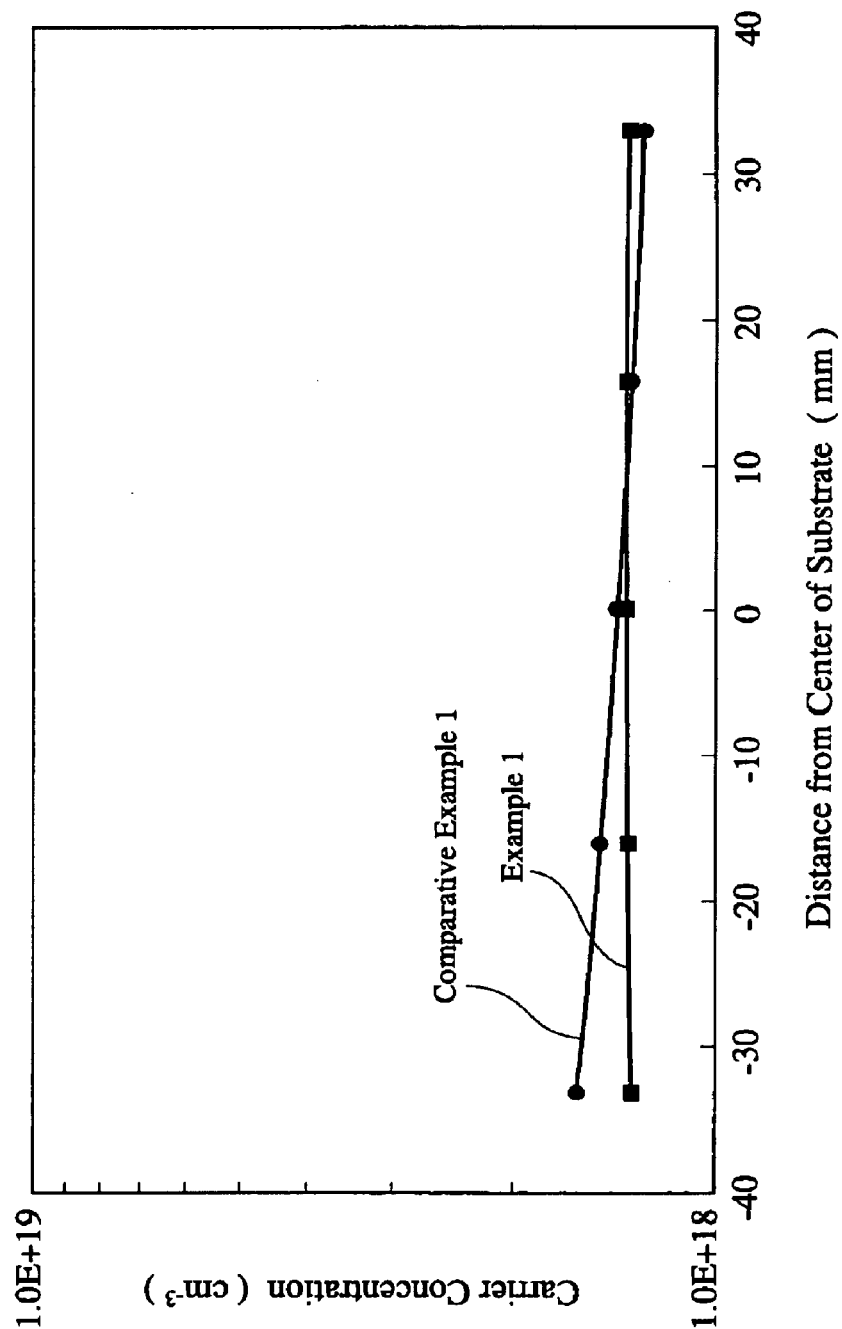
FIG. 2 is a graph showing the radial distributions of carrier concentration in substrates cut out from the GaAs single crystals obtained in Example 1 and Comparative Example 1.

With respect to the substrates of Example 1 and Comparative Example 1, the carrier concentration distributions in their surfaces were measured by a Van der Pauw's method. FIG. 2 shows the radial distribution of carrier concentration of each substrate. As is clear from FIG. 2, the radial distribution of carrier concentration of the GaAs substrate of Example 1 was as low as about 5%, while that of the GaAs substrate of Comparative Example 1 was as high as about 30%. This revealed that the method of the present invention could drastically improve the uniformity of the carrier concentration distribution in the GaAs substrate surface.

About 160 GaAs substrates each as thick as about 700 $\mu$m having a surface orientation offset by 10° from the (100) face direction toward the (011) face direction could be cut out from a cylindrical body portion of the GaAs single crystal of Example 1. On the other hand, in the case of Comparative Example 1, the number of the same GaAs substrates as above was only about 145. This revealed that the utilization efficiency of a single crystal (substrate yield) was improved by the method of the present invention.

Though explanation has been made above, taking a GaAs single crystal for example, the present invention is not restricted thereto, but applicable to the crystal growth of other compound semiconductors such as InP, GaP, etc. Also, though explanation has been made on the VB method as example, the present invention is applicable to other methods such as a vertical gradient freezing method (VGF method), etc.

As described above in detail, because a single crystal obtained by using a seed crystal having an offset crystal orientation in a crystal growth axis direction is sliced in perpendicular to the crystal growth axis direction in the present invention, the resultant substrate is not affected by a carrier concentration distribution in the crystal growth axis direction. Accordingly, the resultant substrate has an extremely uniform radial (in-plane) distribution of carrier concentration. In addition, because slicing is carried out in perpendicular to the crystal growth axis direction of the single crystal, a large number of substrates can efficiently be obtained from a cylindrical body portion of the single crystal, resulting in reduced starting material cost.

What is claimed is:

1. A method for producing an offset substrate of a compound semiconductor single crystal having a dopant comprising the steps of:
   (1) cooling a starting material melt of a compound semiconductor having a dopant with an upward increasing temperature gradient in a crystal-growing container having a seed crystal placed at a lower end, so as to grow a conductive compound semiconductor single crystal having said dopant upward from said seed crystal, and thereafter
   (2) slicing said single crystal having a dopant, wherein the crystal orientation of said seed crystal in a crystal growth axis direction is the same as an offset orientation of said offset substrate, and said resultant conductive compound semiconductor single crystal having said dopant is sliced in perpendicular to the crystal growth axis direction, thereby obtaining said offset substrate having an uniform in-plane carrier concentration distribution in the surface thereof.

2. The method for producing an offset substrate of a conductive compound semiconductor single crystal having a dopant according to claim 1, wherein said crystal orientation is <100>+$\theta$.

3. The method for producing an offset substrate of a conductive compound semiconductor single crystal having a dopant according to claim 2, wherein said offset angle $\theta$ is $2° \leq \theta \leq 55°$.

4. The method for producing an offset substrate of a conductive compound semiconductor single crystal having a dopant according to claim 3, wherein said method is carried out by a vertical Bridgman method.

5. The method for producing an offset substrate of a conductive compound semiconductor single crystal having a dopant according to claim 3, wherein said method is carried out by a vertical gradient freezing method.

6. The method for producing an offset substrate of a conductive compound semiconductor single crystal having a dopant according to claim 2, wherein said method is carried out by a vertical Bridgman method.

7. The method for producing an offset substrate of a conductive compound semiconductor single crystal having a dopant according to claim 2, wherein said method is carried out by a vertical gradient freezing method.

8. The method for producing an offset substrate of a conductive compound semiconductor single crystal having a dopant according to claim 2, wherein said compound semiconductor is a III-V or II-VI compound semiconductor.

9. The method for producing an offset substrate of a conductive compound semiconductor single crystal having a dopant according to claim 1, wherein said method is carried out by a vertical Bridgman method.

10. The method for producing an offset substrate of a conductive compound semiconductor single crystal having a dopant according to claim 1, wherein said method is carried out by a vertical gradient freezing method.

11. The method for producing an offset substrate of a conductive compound semiconductor single crystal having a dopant according to claim 1, wherein said compound semiconductor is a III-V or II-VI compound semiconductor.

12. The method for producing an offset substrate of a conductive compound semiconductor single crystal having a dopant according to claim 3, wherein said compound semiconductor is a III-V or II-VI compound semiconductor.

* * * * *